United States Patent [19]

Ozaki

[11] Patent Number: 5,425,034

[45] Date of Patent: Jun. 13, 1995

[54] SEMICONDUCTOR INTEGRATED LOGIC CIRCUIT WITH INTERNAL CIRCUIT TO BE EXAMINED BY SCAN PATH TEST METHOD

[75] Inventor: Hideharu Ozaki, Tokyo, Japan

[73] Assignee: NEC Corporation, Japan

[21] Appl. No.: 967,727

[22] Filed: Oct. 28, 1992

[30] Foreign Application Priority Data

Oct. 29, 1991 [JP] Japan .................................. 3-282875

[51] Int. Cl.[6] .......................................... H04B 17/00
[52] U.S. Cl. .................................. 371/22.3; 371/22.1
[58] Field of Search ................ 371/22.3, 22.2, 22.1

[56] References Cited

U.S. PATENT DOCUMENTS

| | | | |
|---|---|---|---|
| 4,780,628 | 10/1988 | Illman | 371/22.2 |
| 5,267,247 | 11/1993 | Uehara | 371/22.3 |
| 5,271,019 | 12/1993 | Edwards et al. | 371/22.3 |
| 5,278,842 | 1/1994 | Berry, Jr. et al. | 371/22.3 |

OTHER PUBLICATIONS

Gutfreund; "Integrating the Approaches to Structured Design for Testability", VLSI Design, Oct. 1983, pp. 34–42.

*Primary Examiner*—Ellis B. Ramirez
*Assistant Examiner*—Thomas Peeso
*Attorney, Agent, or Firm*—Laff, Whitesel, Conte & Saret

[57] ABSTRACT

A semiconductor integrated logic circuit making it feasible to perform different testing methods including a scan path test method while retaining a minimized number of an excluseive external terminal for testing. A first internal logic circuit comprises first flip-flop circuits which operate either in a logic operation mode or in a shift register operation mode through an operation mode control signal. At least one second flip-flop circuit is connected to the input side of the first internal logic circuit, which does not participate in the logic operation of the first internal logic circuit and can operate as a shift register together with the first flip-flop circuits. A second internal logic circuit receives the control signal and the output signal of the second flip-flop circuit and performs a predetermined logic such as an OR logic between the signals to thereby generate and output a testing control signal.

11 Claims, 5 Drawing Sheets

SEMICONDUCTOR INTEGRATED LOGIC CIRCUIT WITH INTERNAL CIRCUIT TO BE EXAMINED BY SCAN PATH TEST METHOD

BACKGROUND OF THE INVENTION

1. Field of the Invention

This invention is related to semiconductor integrated logic circuits and more specifically, to semiconductor integrated logic circuits having an internal logical circuit comprising flip-flop circuits whose function can be examined by a scan path test method.

2. Description of the Related Art

Conventionally, on testing a semiconductor integrated logic circuit, test pattern signals are generally input into an external input terminal of the integrated logic circuit to determine whether or not a signal designed as a correct signal is output from an external output terminal of the circuit.

Since semiconductor integrated logic circuits have become increasingly larger, other types of testing methods have been used in which control circuits or testing are circuits incorporated within semiconductor integrated logic circuit. A specified internal logical circuit of the integrated logic circuit can be selectively tested through the corresponding control circuit. For example, many fan-in/fan-out terminals are provided for testing a function of an internal logic circuit of the integrated logic circuit involving outputs signals from the internal circuits are taken out from an external terminal of the integrated circuit by using a previously incoporated control circuit.

For another example, for testing a function of an internal loop circuit of a semiconductor integrated logic circuit, the loop circuit is cut halfway by using a previously incorporated control circuit. An output signal is taken from the resultant partial loop circuit via an external terminal of the integrated logic circuit.

Recently, a scan path test and a compact test methods, shown respectively in FIGS. 1 and 2, have been also used in order to improve the controllability and observability of a semiconductor integrated logic circuit.

In FIG. 1, a semiconductor integrated logic circuit to which is to be tested is illustrated. An internal logic circuit is shown comprising n (n≧2) D-type flip-flop circuits (among them, four (4) circuits 77, 78, 79 and 80). There are n selector circuits connected to the respective flip-flop circuits (among them, four (4) circuits 73, 74, 75 and 76 are shown here) and another internal logic circuit 82 comprising other members thereof.

In response to the operation of the selector circuits 73, 74, 75 and 76, the flip-flop circuits 77, 78, 79 and 80 are connected in series or cascade with each other to operate as a shift register or, are connected to the second internal circuit 82 to perform a specified logic operation. The function of the circuits 77, 78, 79 and 80 can be examined by a scan path test method when the circuits 77, 78, 79 and 80 operate as a shift resister. In the circuit shown in FIG. 1, the selector circuits 73, 74, 75 and 76 constitute a testing control circuit for the flip-flop circuits 77, 78, 79 and 80.

The semiconductor integrated logic circuit also has four (4) external terminals 70, 71, 72 and 73 for the flip-flop circuits 77, 78, 79 and 80. The terminal 70 is exclusively for testing the input test control signals fed into the selector circuits 73, 74, 75 and 76 and thus is not used in a normal logical operation. On the other hand, the terminals 71, 72 and 73 are used for both of the normal logic operation and a testing operation. The terminal 71 serves as a data signal input terminal to input data signals into the first-stage flip-flop circuit 77. The terminal 72 serves as a clock signal input terminal for input clock signals fed into respective circuits 77, 78, 79 and 80. The terminal 81 serves as a data signal output terminal to take out output signals from the last-stage flip-flop circuit 80.

The selector circuits 73, 74, 75 and 76 respectively incorporated in the data lines of the flip-flop circuits 77, 78, 79 and 80 are operated simultaneously according to a testing control signal input through the external terminal 70. Then, the circuit 73 selects a path for the data signal input through the data input terminal 71 between the first-stage flip-flop circuit 77 and the internal logic circuit 82. The circuit 74 selects a path for the output signal from the circuit 77 between the second flip-flop circuit 78 and the circuit 82. The circuit 75 selects a path for the output signal from flip-flop circuit 78 between the third-stage flip-flop circuit 79 and the circuit 82. Similarly, the selector circuit 76 selects path for the output signal from the (n−1)th-stage flip-flop circuit (not shown in the figure) between the last-stage (n)th-flip-flop circuit and the circuit 82.

When a testing control signal of a high-level (H) is input into the terminal 70, the selector circuits 73, 74, 75 and 76 select respectively the flip-flop circuit as a path for the signal. As a result, the respective flip-flop circuits 77, 78, 79 and 80 operate as a "shift register" to shift the signal from the terminal 71 sequentially from the first flip-flop circuit 77 toward the last-stage flip-flop circuit 80 in response to a clock signal input into the terminal 72. When a testing control signal of a low-level (L) is input, the selector circuits 73, 74, 75 and 76 select, respectively, the internal logic circuit 82 as the path, so that the flip-flop circuits 77, 78, 79 and 80 perform a normal logical operatiodn intrinsic to the semiconductor integrated logic circuit.

Therefore, on examining, by a scan path test method, the flip-flop circuits 77, 78, 79 and 80 shown in FIG. 1, a high-level (H) testing control signal is inputted through the external terminal 70 to set the operation mode in the "shift register operation mode." When a testing scan signal and a clock signal are input respectively into the terminals 71 and 72, output signals from the circuits 77, 78, 79 and 80 are then outputted sequentially from the terminal 81, thus permitting an easy test of the function of the flip-flop circuits 77, 78, 79 and 80.

To allow the integrated logic circuit to perform its normal logic operation, a low-level (L) testing control signal is input into the terminal 70 to set the operation mode in the "logic operation mode." Then, a data signal and a clock signal for the logic operation are input into the terminals 71 and 72, respectively, and an output data signal is obtained from the terminal 81.

Therefore, the semiconductor integrated logic circuit shown in FIG. 1 requires the external terminal 70 as an exclusive termnal for testing. In addition, though not illustrated in FIG. 1, the integrated logic circuit in FIG. 1 requires another exclusive external terminal or terminals for testing as occasion demands.

FIG. 2 shows the compact test method devised to save labor required for making test patterns. In this method, test patterns are generated randomly in a random pattern generator 90 and the test patterns thus generated are used for testing the function of a semiconductor integrated logic circuit. Such patterns are input into a circuit 91 to be tested. An enormous number of the resultant output signals are compressed by a compression function 92. The data-compressed output signals are then compared with the expectation values 92 obtained by an operation simulation to get a judgement result 94.

Sometimes, the scan path test method shown in FIG. 1 and the compact test method shown in FIG. 2 are not suitable depending upon the functions and/or configurations of circuits to be tested. Therefore, since semiconductor integrated logic circuits have recently become so large, the integrated logic circuit generally tends to be incoporated with a testing circuit or circuits so as to enable a selection of testing methods according to the functions and/or configurations of the internal logic circuits constituting the integrated logic circuit.

When examining the function of the integrated logic circuit which can selectively perform different test methods, various types of control signals are required such as those for selecting testing methods and those for stopping an other function or functions temporarily on testing a specified function, in addition to minimal control signals for testing. Thus there arises a problem because many external terminals exclusively for testing are required for input and/or outut of such control signals, in addition to the external terminals for the normal logic operation of the integrated logic circuit.

SUMMARY OF THE INVENTION

Therefore, an object of this invention is to provide a semiconductor integrated logic circuit which can be selectively examined by a plurality of different testing methods including the scan path test method, while retaining a minimized number of exclusive external terminals for testing, which external terminals are unnecessary for the intrinsic function of the integrated logic circuit.

The semiconductor integrated logic circuit according to this invention comprises a first internal logic circuit containing first flip-flop circuits, a second flip-flop circuit and a second internal logic circuit. In the first internal logic circuit, the first flip-flop circuits can be optionally operated either in a logic operation mode for performing a specified logic operation or in a shift register operation mode for performing a shift register operation through an operation mode control signal.

The second flip-flop circuit is connected to the input side of the first internal logic circuit and can be operated as a shift register together with the first flip-flop circuits, without participating in the logic operation of the first internal logic circuit.

The second internal logic circuit receives the operation mode control signal and the output signal from the second flip-flop circuit and outputs a corresponding testing control signal according to a predetermined logic of the signals.

In the semiconductor integrated logic circuit according to this invention, when the first flip-flop circuits are set in the shift register operation mode, if a clock signal and a scan signal are input respectively into external terminals for clock input and data input of the circuit, output signals of the respective first flip-flop circuits are sequentially outputted from an external terminal for data input of the circuit according to a clock signal. Accordingly, the function of the first flip-flop circuits can be examined easily by the scan path test method.

On examining by the scan path test method, the external terminals for scan signal input and output also serve as terminals for data signal input and output used in the logic operation of the integrated circuit, so that only an external terminal for operation mode control signal is required as an exclusive external terminal for testing.

In addition, the test control signal outputted from the second logic circuit can be used for various types of control operation such as a selection of the testing methods, partial stopping of a function or functions and the like, which eliminates the need of external terminal or terminals for the input and/or outut of such control signals.

Consequently, according to the semiconductor integrated logic circuit of this invention, selective performance of a plurality of different testing methods including the scan path test method can be realized, while retaining a minimized number of exclusive external terminals used only for testing which are unnecessary for the intrinsic operation of the circuit.

In the integrated circuit of this invention, the operating logic of the second internal logic circuit is preferably set so that the output signal of the second internal logic circuit may vary corresponding to the output signal of the second flip-flop circuit. In this case, there is an advantage because a test or tests or other internal logic circuit or circuits can be controlled by the signal which is input into the second flip-flop circuit to obtain the testing control signal. The operating logic of the second internal logic circuit is preferably an OR logic.

Though the second flip-flop circuit may be a single flip-flop, two (2) or more flip-flop circuits are preferably provided. In this case, the number of the second internal logic circuits may be increased according to the number thereof, resulting in testing control signals in a number which equal the number of the second logic circuits. In addition, a logic different from the original logic of the second internal logic circuits may be generated by combining two or more second internal logic circuits. Therefore, an arrangement of two or more second flip-flop circuits leads to an advantage of higher testing flexibility for other internal logic circuits.

The semiconductor integrated logic circuit of this invention preferably has a third internal logic circuit which is changeable between an intrinsic logic operation mode and a test operation mode on receiving the testing control signal. In this case, the third internal logic circuit is preferably arranged so that the circuit may be examined through the external terminal or terminals for the logic operation of the integrated circuit. Such an arrangement makes it feasible that the third internal logic circuit can be examined from outside by setting properly the input signal to the second internal logical circuit.

The second flip-flop circuit is preferably the same type or function as that of the first flip-flop circuit; however, the flip-flop may also be of a different type.

DESCRIPTION OF THE PREFERRED EMBODIMENTS

Preferred embodiments of this invention will be described below referring to FIGS. 3, 4 and 5.

First Embodiment

Figure 3:
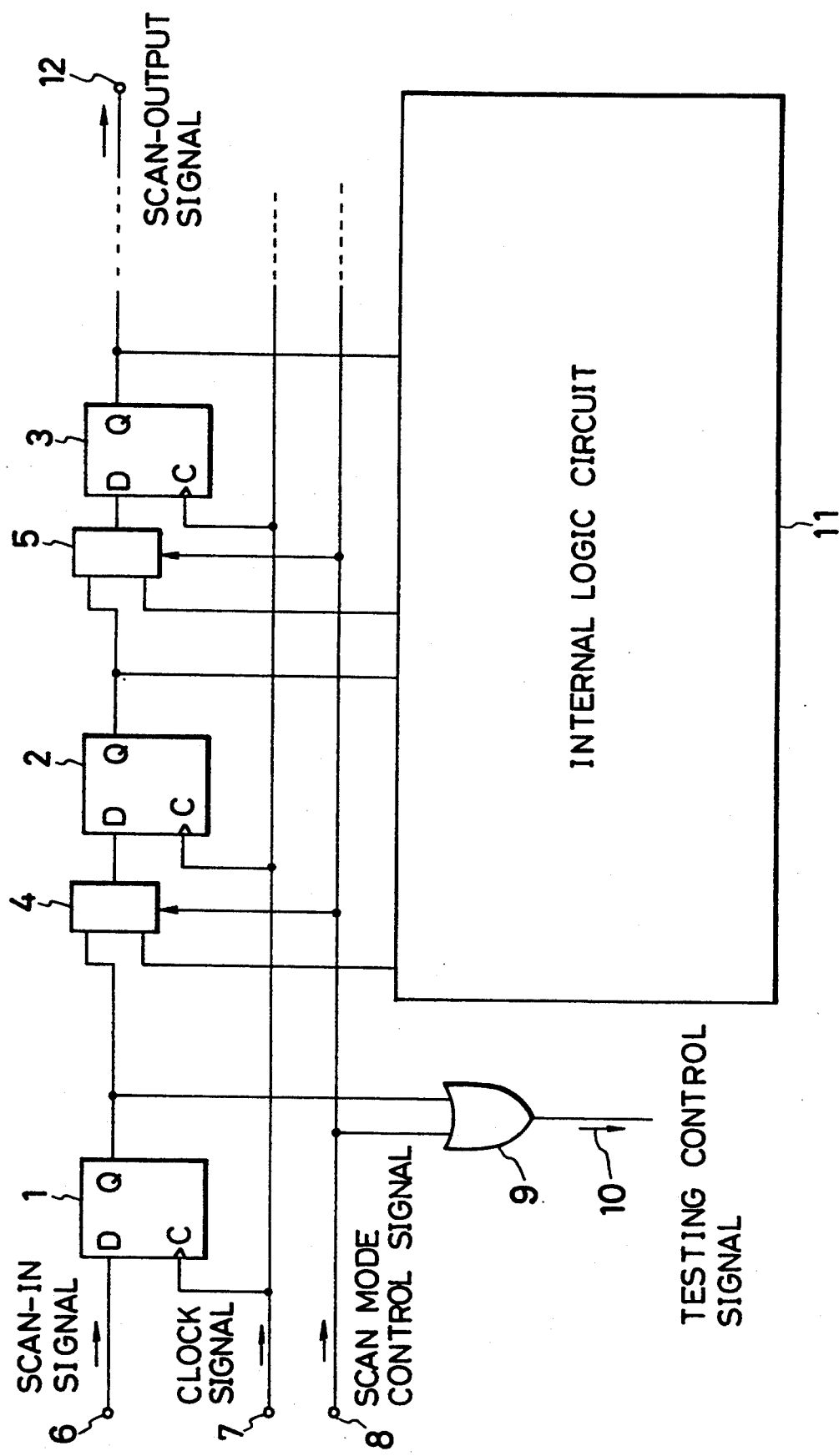
FIG. 3 is a block diagram showing a circuit configuration for examining, by the scan path test method, on the semiconductor integrated logic circuit according to a first embodiment of this invention.

FIG. 3 shows a semiconductor integrated logic circuit of a first embodiment of this invention. The circuit comprises a first internal logic circuit containing n ($n \geq 2$) D-type first flip-flops circuits (among them, the first- and second-stage flip-flop circuits 2 and 3 are shown here) and n selector circuits (among them, the first- and second-stage selector circuits 4 and 5 are shown here) connected respectively to the first flip-flop circuits. A third internal logic circuit 11 contains other members thereof. The n first flip-flop circuits are connected in series with each other or connected to the third internal logic circuit 11 in response to the action of the n selector circuits. When connected in series with each other, the first flip-flop circuits operate as a shift regisgter and on the other hand, when connected to the internal logic circuit 82, they perform a specified logic operation.

Figure 1:
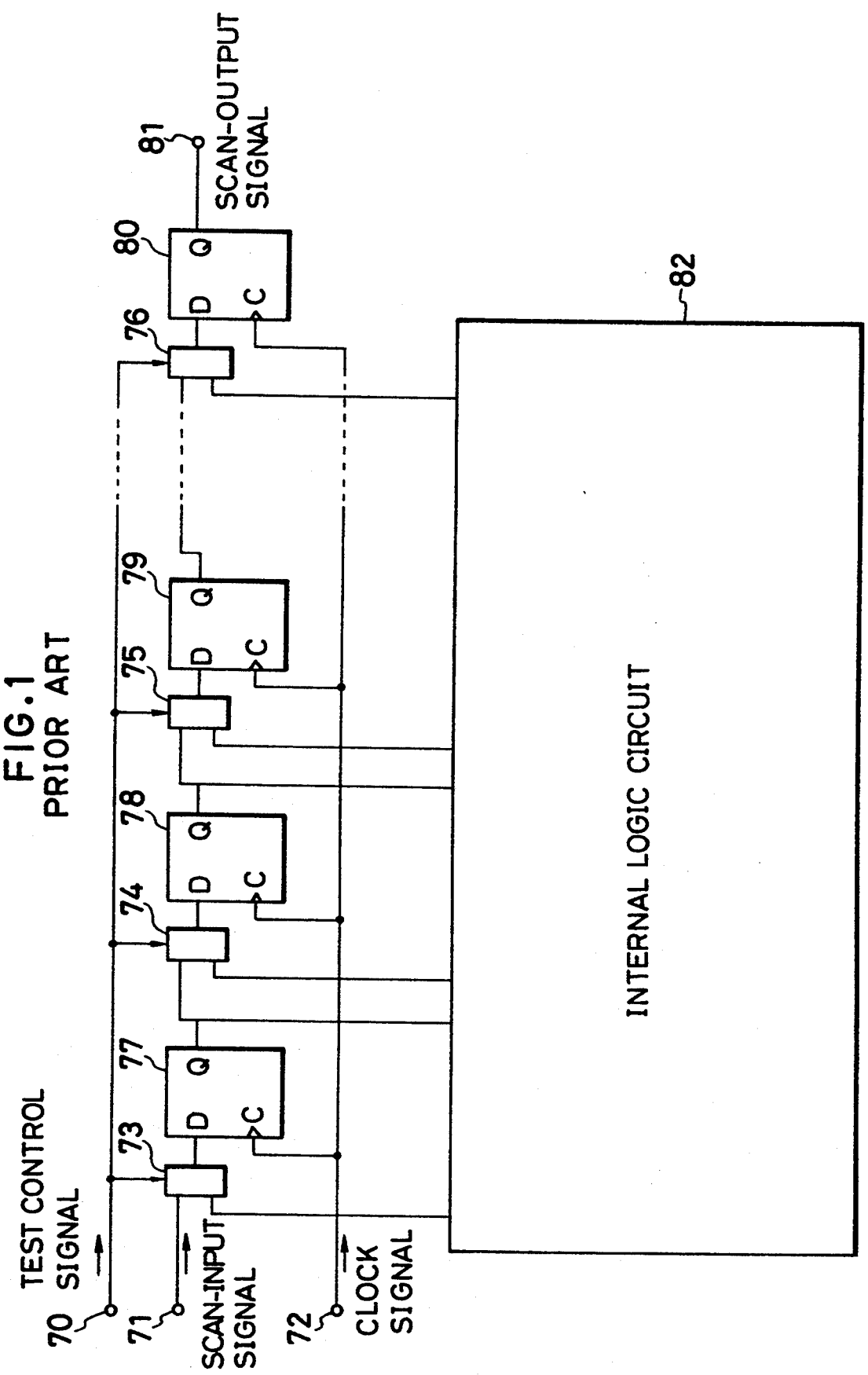
FIG. 1 is a block diagram showing a circuit configuration for examining, by the scan path test method, on a conventional semiconductor integrated logic circuit.
Figure 2:
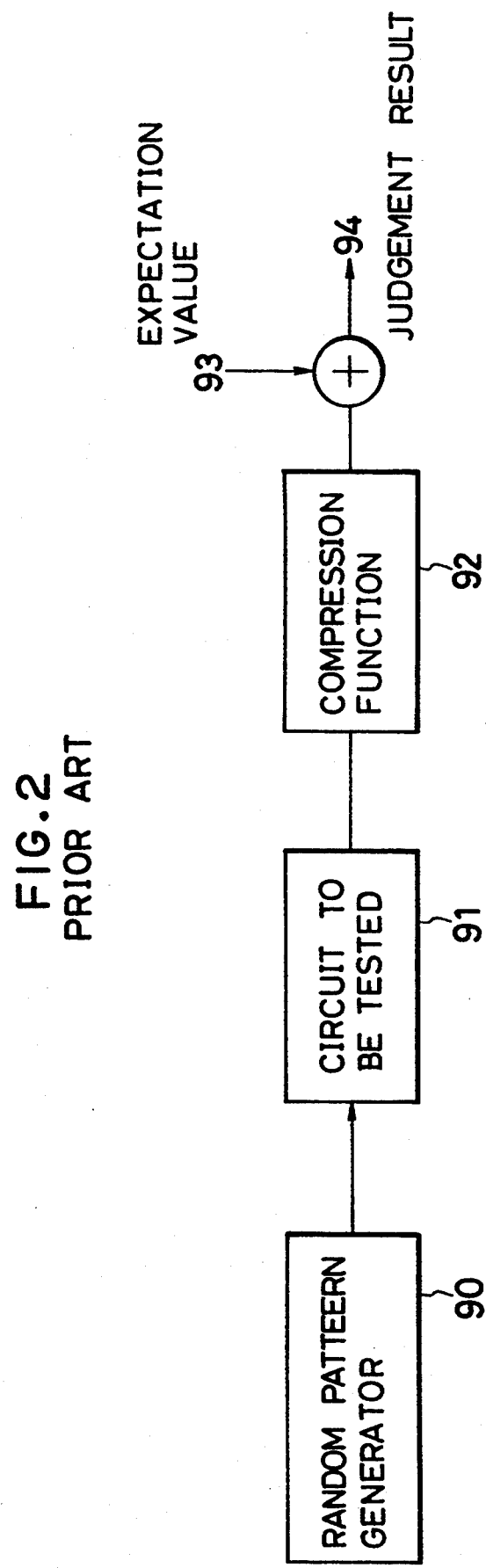
FIG. 2 shows a concept of a conventional compact test method.

The configuration mentioned above is same as that of the conventional circuit shown in FIG. 1.

In the semiconductor integrated logic circuit of this invention, a second flip circuit 1 of the same D-type as that of the first flip-flop circuits of the first internal logical circuit is incoporated in lines between the external terminals 6 and 7 and the first-stage flip-flop circuit 2 of the first internal logic circuit. The second flip-flop circuit 1 can be operated, together with the first flip-flop circuits of the first internal logic circuit, as a shift register, but it does not participate in the logic operation of the integrated logic circuit. A data input terminal D and a clock input terminal C of the second flip-flop circuit 1 are connected to the external terminals 6 and 7 respectively, while a data output terminal Q of the circuit 1 is connected to the first-stage selector circuit 4.

The integrated logic circuit is provided further with an OR circuit 9 as a second internal logic circuit. Two (2) input terminals of the OR circuit 9 are connected to the data output terminal Q of the flip-flop circuit 1 and the external terminal 8 respectively. One of the output terminals of the circuit 9 is connected to another internal logic circuit (not shown) to be tested within the integrated logic circuit. The OR circuit 9 also does not participate in the logic operation of the integrated logic circuit.

During a scan path test, the terminal 6 for data signal input serves as a scan-input terminal for inputting a scan signal. The terminal 7 receives clock signals for inputting a test clock signal. The terminal 12 provides a data signal output serves as a scan-output terminal for outputting a scan signal. The terminal 8 is an exclusive testing terminal to provide an input scan mode control signal to the respective selector circuits of the first internal logic circuit, and is out of use during a normal logic operation.

The n selector circuits arranged in the data lines of the respective flip-flop circuits of the first internal logic circuit are operated simultaneously by a scan mode control signal inputted through the terminal 8. The first-stage selector circuit 4 selects a path for the data signal which is input through the terminal 6 between the first-stage flip-flop circuit 2 and the internal logic circuit 11. The second selector circuit 5 selects a path for the output signal from the first-stage flip-flop circuit 2 between the second stage flip-flop circuit 3 and the circuit 11. In the same way, the (n)th-stage or last-stage selector circuit (not shown) selects a path for the output signal from the (n−1)th-stage flip-flop circuit (not shown) between the (n)th-stage flip-flop circuit and the circuit 11.

In each selector circuit of the first internal logic circuit, if a high-level (H) scan mode control signal is input through the external terminal 8, the flip-flop circuit is selected. As a result, the flip-flop circuits of the first internal logic circuit operate as a "shift register" which shifts and outputs sequentially the data signals input into the terminal 6, in the direction from the first-stage flip-flop circuit 2 toward the last stage flip-flop circuit, in response to the clock signal input through the terminal 7.

If a low-level (L) scan control signal is inputted, the third internal logic circuit 11 is selected as the path for the signals, so that the flip-flop circuits of the first internal logic circuit perform the logical operation intrinsic to the integrated logic circuit. To examine the n first flip-flop circuits of the first internal logic circuit by the scan path test method, a high-level (H) scan mode control signal is input through the external terminal 8 to set the mode in the "shift register operation mode." Then, a test scan and a clock signal are input respectively through the external terminals 6 and 7. As a result, the second flip-flop circuit 1 and the n first flip-flop circuits operate as a shift register. The output signals from the respective n flip-flop circuits are sequentially outputted from the external terminal 12, resulting in an easy testing of the logic functions of the first flip-flop circuits.

To allow the integrated logic circuit to perform its normal logic operation, a low-level (L) scan mode control signal is simply input through the terminal 8 to set the mode in the "logic operation mode." Then, a data signal and a scan signal are input through the terminals 6 and 7 respectively, which makes the first flip-flop circuits perform their normal logic operations together with the third internal logic circuit 11.

As described above, in the semiconductor integrated logic circuit of this embodiment, the external terminals 6, 7 and 12 are used commonly in both normal logic operation and a scan path testing operation. The exclusive external terminal required for the scan path test method is only the signal external terminal 8 for inputting a scan mode control signal, as with the conventional semiconductor integrated logic circuit referred to in to FIG. 1.

In addition, during the scan path test, since the second flip-flop circuit 1 is connected in series to the n first flip-flop circuits, it should be noted that (n+1) scan signal data and (n+1) clock signal pulses are to input through the terminals 6 and 7 in order to set the first flip-flop circuits in a specified logic status. To read out the logic statuses of the flip-flop circuits 2 and 3 at that time, (n+1) clock signals are to be input through the terminal 7.

In this embodiment, the OR circuit 9 constituting the second internal logic circuit which does not participate in the logic operation performs the OR logic between the output signals from the second flip-flop circuit 1 and the scan mode control signal, and outputs a resultant signal of the OR logic as a testing control signal 10. The signal 10 may be used, for example, for selecting a testing method or for stopping some functions of a circuit on performing a different testing method, which eliminates the need of external terminals for inputting testing control signals necessary for such method.

When the first internal logic circuit is in the shift register operation mode, the input scan mode control signal is of the high level (H), so that, independent of the logic status of the output signal from the second flip-flop circuit 1, the testing control signal 10 is of the high-level (H). That is, the logic status of the signal 10 is the same as that of the scan mode control signal.

When the first internal logic circuit is in the logic operation mode, the input scan mode control signal is of the low-level (L), so that the testing control signal 10 becomes the low-level (L) if the output signal from the second flip-flop circuit 1 is of the low-level (L), and becomes the high-level (H) if the output signal from the circuit 11 is of the high-level (H). That is, the logic status of the signal 10 is the same as that of the output signal from the circuit 1.

Since the logic status of the output signal of the second flip-flop circuit 1 is thus inherited directly to the testing control signal 10 in the logic operation mode of the first internal logic circuit, a test on the function of another internal logic circuit can be controlled with the control signal 10 by properly setting an input signal to the second flip-flop circuit 1. FIG. 4 illustrates such an internal logic circuit embodying this control, in the circuit in FIG. 4, a function of a read-only memory (ROM) 20 can be tested separately from other internal logic circuits.

Figure 4:
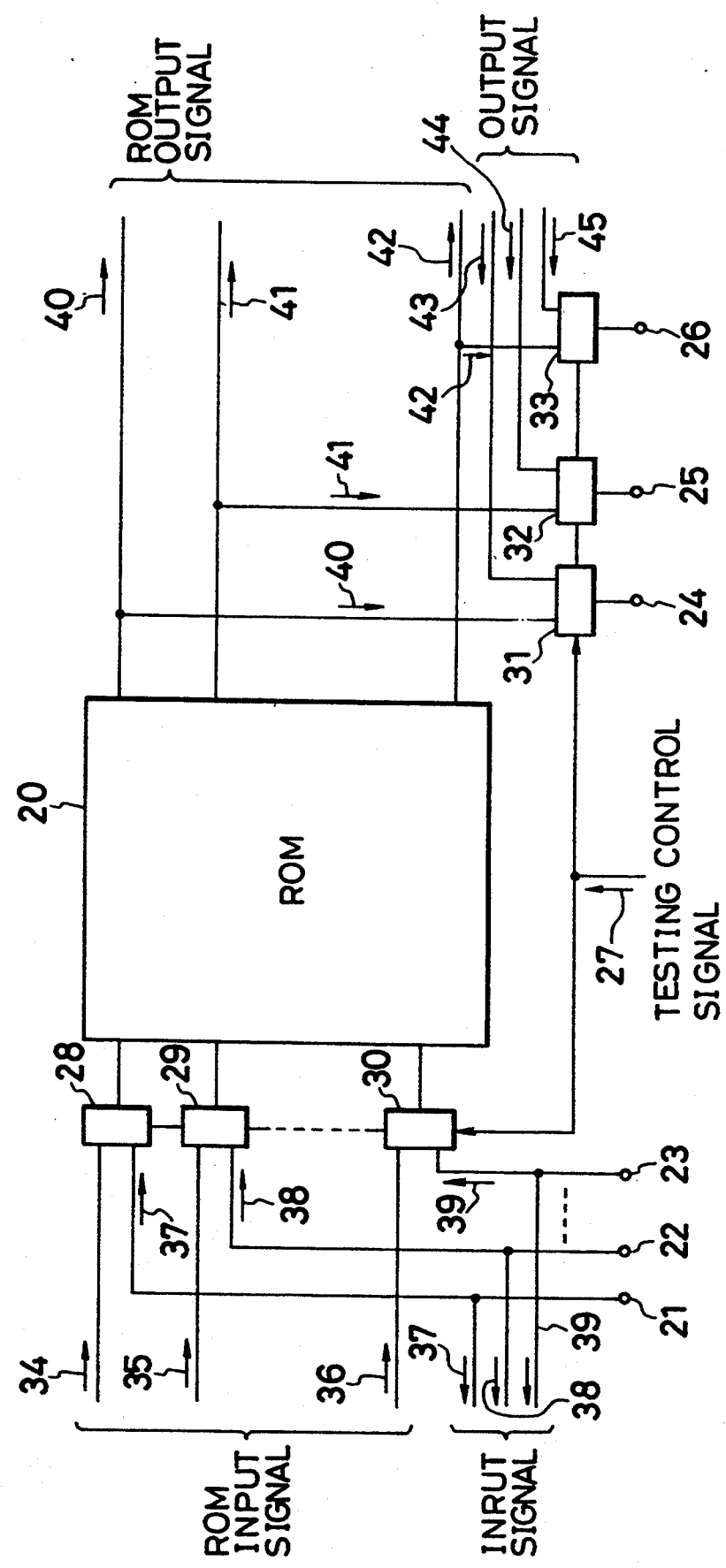
FIG. 4 is a block diagram showing a circuit configuration for examining other internal logic circuit within the integrated logic circuit of the first embodiment.

In FIG. 4, the ROM 20 is an internal logic circuit within the integrated logic circuit shown in FIG. 3 and is changeable between an intrinsic "logic operation mode" and a "test operation mode" by controlling the selector circuits (among them, six (6) selector circuits 28, 29, 30, 31, 32 and 33 are shown here) through the testing control signal 27. For example, the ROM 20 is set in the logic operation mode if the signal 27 is of a low-level logic status and is the test operation mode if the signal 27 is of a high-level logic status.

In the logic operation mode, the input-side selector circuits 28, 29 and 30 connect the lines of input signals 34, 35 and 36 to the ROM 20 so that the signals 34, 35 and 36 are sent to the ROM 20. In this case, testing input signals 37, 38 and 39, input through external terminals 21, 22 and 23, are sent to the internal logic circuit other than the ROM 20.

In the logic operation mode, the output-side selector circuits 31, 32 and 33 connect output lines of another internal logic circuit to respective external output terminals 24, 25 and 26, allowing output signals 43, 44 and 45 to be sent toward the circuits 31, 32 and 33 to be taken out from external terminals 24, 25 and 26. In this case, the lines of the output signals 43, 44 and 45 of the ROM 20 are disconnected from the terminals 24, 25 and 26.

In the test operation mode, the selector circuits 28, 29 and 30 disconnect the lines of the input signals 34, 35 and 36 from the ROM 20 and, instead, connect them to the external input terminals 21, 22and 23, thus making it feasible to send testing input signals 37, 38 and 39 input through the terminals 21, 22 and 23 to the ROM 20. On the other hand, the selector circuits 31, 32 and 33 disconnect output lines of another internal logic circuit from the external output terminals 24, 25 and 26 and then connect lines of output signals 40, 41 and 42 of the ROM 20 to the terminals 24, 25 and 26, allowing the output signals 40, 41 and 42 to be taken out from ROM 20.

Therefore, the ROM 20 can be separated from the other internal logic circuits by setting the ROM 20 in the test operation mode through the control signal 27. Then, a simple input of a testing signal through the terminals 21, 22 and 23 leads to output of signals showing the results associated with the logic operation of the ROM 20 alone from the terminals 24, 25 and 26. In this way, the logic operation associated solely with the ROM can be easily tested from outside.

If the testing control signal 10 obtained in the circuit in FIG. 3 is employed as the signal 27, a test on the function of the ROM 20 in FIG. 4 can be pereformed directly from outside of the integrated logic circuit by properly setting a logic status of the second flip-flop cirduit 1, eliminating the need of an external terminal exclusively for input and/or output or control signals for changing the testing method. In this case, any suitable testing method other than the scan path method can be optionally pereformed.

The six external terminals 21 to 26 are not exclusive testing terminals but may be also used as external terminals for the normal logic operation.

Second Embodiment

Figure 5:
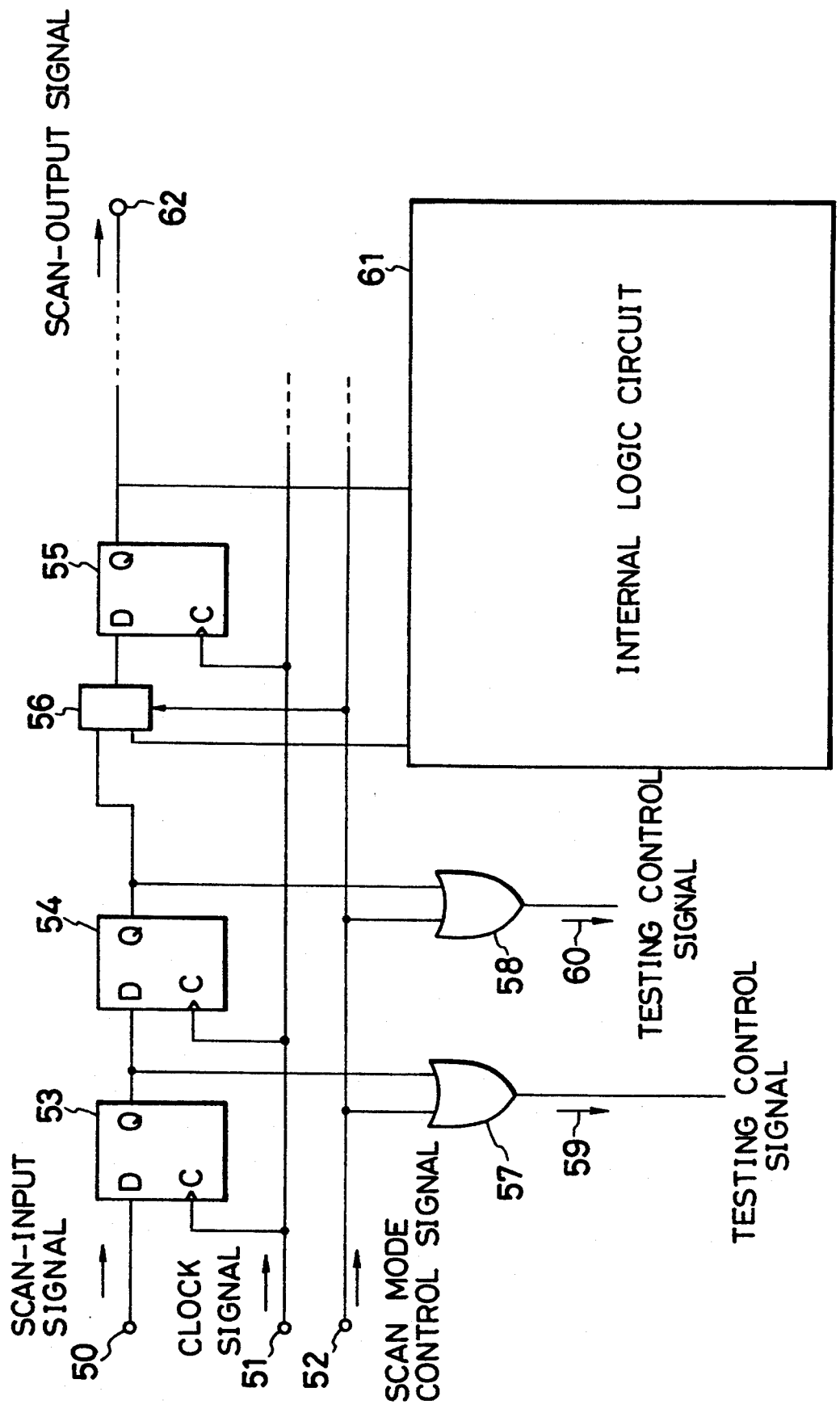
FIG. 5 is a block diagram showing a circuit configuration for examining, by the scan path test method, on a semiconductor integrated logic circuit according to a second embodiment of the invention.

FIG. 5 shows a semiconductor integrated logic circuit of a second embodiment of this invention. The circuit is equivalent to the circuit of the first embodiment with an added second flip-flop circuit and an OR circuit.

As with the first embodiment, the circuit in FIG. 5 comprises a first internal logic circuit containing n (n≧2) first D-type flip-flop circuits (among them, only the first-stage flip-flop circuit 55 is shown here) and n selector circuits (among them, only the first-stage selector circuit 56 is shown here) connected to the respective first flip-flop circuits and a third internal logic circuit 61 containing other members thereof. The n first flip-flop circuits are connected in series with each other to operate as a sift register or to connected to the third logic circuit 61 to perform a specified logic operation in response to the action of the n selector circuits.

Second flip-flop circuits 53 and 54 can be operated, together with the first flip-flop circuits, as a shift register, and do not participate in the logic operation of the integrated logic circuit. Data signals are input into the data input terminal D of the circiut 53 through the external terminal 50. An output signal of the circuit 53 is in turm inputted into the data input terminal D of the circuit 54. An output signal of the circuit 54 is inputted into the data input terminal D of the first flip-flop circuit 55 through the first-stage selector circuit 56. Clock signals are inputted into the clock input terminals C of the second flip-flop circuits 53 and 54 and the n first flip-flop circuits through the external terminal 51. An output signal from the last-stage first flip-flop circuit (not shown) is output from an exterrnal terminal 62. A scan mode control signal is input into the n selector circuits through an external terminal 52, thereby the selector circuits switch at the same time.

Input terminals of an OR circuit 57, serving as a second internal logic circuit, are connected to the data output terminal Q of the flip-flop circuit 53 and the terminal 52 respectively. Input terminals of an OR circuit 58, also serving as a second internal logic circuit, are connected to the data output terminal Q of the circuit 54 and the terminal 52 respectively. Output terminals of the OR circuits 57 and 58 are connected to another internal logic circuit (not shown) to be tested within the integrated logic circuit. These circuits 57 and 58 also do not participate in the logic operation of the integrated logic circuit.

With respect to the respective selector circuits, the n flip-flop circuits of the first internal logic circuit operate as a "shift register" in case of a scan mode control signal sent from the terminal 52 being of a high-level (H), thereby allowing the system to examine by the scan path test method. In case of the scan mode signal being of a low-level (L), they perform the normal logic operation of the integrated circuit.

The OR circuit 57 performs an OR logic between the output signal of the second flip-flop circuit 53 and the scan mode control signal to output the result of the logic as a testing control signal 59. Similar to the case of the first embodiment, when the first internal logic circuit is in the shift register mode, the logic status of the signal 59 is equal to that of the input scan mode control signal, independent of the logic status of the output signal of the second flip-flop circuit 53. On the other hand, when in the logic operation mode, the logic status of the signal 59 is equal to that of the output signal of the second flip-flop circuit 53.

similarly, the OR circuit 58 performs an OR logic between the output signal of the second flip-flop circuit 54 and the scan mode control signal to output the result of the logic as a testing control signal 60. When the first internal logic circuit is in the shift register operation mode, the logic status of the signal 60 is equal to that of the input scan control signal, independent of the logic status of the output signal of the second flip-flop circuit 54. On the other hand, when in the logic operation mode, the logic status of the signal 60 is equal to that of the output signal of the second flip-flop circuit 54.

In this second embodiment, a simultaneous test of two internal logic circuitc san be controlled owing to the feasibility of generating two test control signals. In addition, logics other than the OR logic may be generated by combining the signals 59 and 60, providing another advantage that higher flexibility of control of testing other internal logic circuits can be obtained.

In the semiconductor integrated logic circuits of the two embodiment, as described above, the functions of the internal logic circuits can be examined by two or more different testing methods including the scan path test method. During the performing of the scan path test, the required exclusive testing external terminal is only a single terminal for inputting a scan mode control signal. Furthermore, even in case a method other than the scan path test method is performed, there is not need for providing an external terminal for an inut of a test control signal, thus allowing a reduction in the number of a exclusive testing external terminals.

Though the first and seconf flip-flop circuits are of the D type in the above embodiments, they may be optionally of a type other than the D-type. In addition, in the embodiments, the OR circuits are employed as the second internal logic circuit, but also available are other logic circuits, such as AND, NAND and NOR circuits, according to the logic of the scan mode control signal or any desired testing control signal.

What is claimed is:

1. A semiconductor integrated logic circuit which performs a given logic operatioin, said circuit comprising:
   (a) a first internal logic circuit containing a plurality of first flip-flop circuits;
      said plurality of first flip-flop circuits operating in either a logic operation mode or a shift register mode, said logic operation mode and said shift register mode being selected in response to an operation mode control signal;
      said plurality of first flip-slop circuits performing said given logic operation of said semiconductor integrated logic circuit while in said logic operation mode;
      said plurality of first flip-flop circuits operating as a first shift register while in said shift register mode;
   (b) a second flip-flop circuit coupled to an input side of said first internal logic circuit;
      said second flip-flop circuit being connected to said plurality of first flip-flop circuits in order to operate as a second shift register while in said shift register mode;
      said second flip-flop circuit not being used for said given logic operation of said semiconductor integrated logic circuit while in said logic operation mode; and
   (c) a second internal logical circuit for receiving said operation mode control signal and an output signal of said second flip-flop circuit;
      said second internal logic circuit performing a logic operation to output a testig control signal responsive to logic states of said operation mode control signal and said output signal of said second flip-flop circuit;
      said second internal logic circuit not being used for said given operation of said semiconductor integrated logic circuit while in said logic operation mode;
      said testing control signal being able to be used for testing said semiconductor integrated logic circuit; wherein
   (d) on testing said plurality of first flip-flop circuits, said plurality of first flip-flop circuits are switched to said shift register mode in response to said operation mode control signal so that said plurality of first flip-flop circuits and said second flip-flop circuit act as said second shift register;
      a testing input signal being supplied to an input end of said second shift register and a testing output signal being derived from an output end of said second shift register.

2. The circuit as claimed in claim 1, wherein a logic of said second internal logic circuit is set so that said testing control signal from said second internal logic circuit varies corresponding to an output signal of said second flip-flop circuit.

3. The circuit as claimed in claim 2, wherein said second internal logic circuit is an OR logic.

4. The circuit as claimed in claim 1, wherein there are a plurality of said second flip-flop circuits, and a plurality of said second internal logic circuits corresponding to said plurality of said second flip-flop circuits.

5. The circuit as claimed in claim 1, further comprising a third internal logic circuit;

said third internal logic circuit operating in a second logic operation mode and a test operation mode, said second logic operation mode and said test operation mode being selected in response to said testing control signal from said second internal logic circuit.

6. The circuit as claimed in claim 5, wherein said testing control signal from said second internal logic circuit is used for separating said third internal logical circuit;

a testing input signal being supplied through a first external terminal of said semiconductor integrated logic circuit to said third internal logic circuit; and a testing output signal being derived through a second external terminal of said semiconductor integrated logic circuit from said third internal logic circuit.

7. The circuit as claimed in claim 5, wherein said testing control signal from said second internal logic circuit is used for separating said third internal logic circuit to test said third internal logic circuit.

8. The circuit as claimed in claim 1, wherein said second flip-flop circuit and said plurality of said first flip-flop circuits are the same type of circuit.

9. The circuit as claimed in claim 1, wherein a scan path test input signal is generated as said testing input signal in response to a testing of said plurality of first flip-flop circuits while in said shift register mode, and said generated scan path test input signal is supplied to said input end of said second shift register, and a scan path test output signal is generated as said testing output signal is being derived from said output end of said second shift register.

10. The circuit as claimed in claim 1, wherein a clock signal is supplied to said plurality of first flip-flop circuits and to said secind flip-flop circuit when testing said plurality of first flip-flop circuits while in said shift register mode;

a scan path test input signal being supplied as said testing input signal to said input end of said second shift register in synchronization with said clock signal; and a scan path test output signal being generated as said testing output signal at said output end of said second shift register in synchronization with said clock signal.

11. A semiconductor integrated logic circuit comprising:

a first internal logic circuit (11) operating in a logic operation mode and a test operation mode;

a data input terminal (6) for receiving a data input signal;

a clock input terminal (7) for receiving a clock signal;

a control input terminal (8) for receiving a mode control signal, said mode control signal having first and second states;

a data output terminal (12) for outputting a data output signal;

a first register (1) for storing and outputting said data input signal in response to said clock signal;

a second register (2) for storing and outputting an output from said first register to said data output terminal in response to said clock signal;

said first internal logic circuit operating in said test operation mode in response to said mode control signal being in said first state, said first and second registers being connected to each other to form a shift register, said shift register storing and sequentially outputting said data input signal to said data output terminal;

said first internal logic circuit operating in said logic operation mode in response to said mode control signal being in said second state, said first internal logic circuit being coupled to receive said output from said first register to perform a given logic operation of said semiconductor integrated logic circuit; and a second internal logic circuit (9) for outputting a testing control signal in response to said mode control signal and an output signal of said first register.

* * * * *